United States Patent [19]
Choi et al.

[11] Patent Number: 5,753,046
[45] Date of Patent: May 19, 1998

[54] VERTICAL DIFFUSION FURNACE AND CAP THEREFOR

[75] Inventors: Sang-kook Choi; Sang-woon Kim, both of Suwon-city, Rep. of Korea

[73] Assignee: Samsung Electronics Co., Ltd., Suwon-city, Rep. of Korea

[21] Appl. No.: 755,160

[22] Filed: Nov. 22, 1996

[51] Int. Cl.⁶ .......................... C23C 16/00; F27B 1/00; F27B 1/10
[52] U.S. Cl. .................. 118/724; 118/725; 118/715; 432/241; 432/250; 432/205; 432/152
[58] Field of Search .................. 118/724, 725, 118/715; 219/390, 391, 406, 411; 392/416, 418; 432/65, 125, 152, 205, 241, 250

[56] References Cited

U.S. PATENT DOCUMENTS

| | | | |
|---|---|---|---|
| 3,705,567 | 12/1972 | Emels | 118/725 |
| 4,412,812 | 11/1983 | Sadowski et al. | 432/121 |
| 4,745,088 | 5/1988 | Inoue et al. | 437/102 |
| 4,766,013 | 8/1988 | Warren | 427/228 |
| 4,943,234 | 7/1990 | Sohlbrand | 432/152 |
| 4,989,540 | 2/1991 | Fuse et al. | 118/719 |
| 4,992,044 | 2/1991 | Philipossian | 432/253 |
| 5,064,367 | 11/1991 | Philipossian | 432/253 |
| 5,127,365 | 7/1992 | Koyama et al. | 118/724 |
| 5,146,869 | 9/1992 | Bohannon et al. | 118/724 |
| 5,164,012 | 11/1992 | Hattori | 118/725 |
| 5,217,560 | 6/1993 | Kurono et al. | 156/345 |
| 5,252,062 | 10/1993 | Groves et al. | 432/205 |
| 5,252,133 | 10/1993 | Miyazaki et al. | 118/725 |
| 5,279,670 | 1/1994 | Watanabe et al. | 118/725 |
| 5,318,633 | 6/1994 | Yamamoto et al. | 118/725 |
| 5,332,557 | 7/1994 | Sahoda et al. | 422/199 |
| 5,441,570 | 8/1995 | Hwang | 118/725 |
| 5,458,685 | 10/1995 | Hasebe et al. | 118/724 |
| 5,478,397 | 12/1995 | Shibata et al. | 118/724 |
| 5,482,558 | 1/1996 | Watanabe et al. | 118/728 |
| 5,503,678 | 4/1996 | Usami | 118/724 |
| 5,533,736 | 7/1996 | Yamaga | 277/3 |
| 5,540,782 | 7/1996 | Miyagi et al. | 118/724 |
| 5,554,226 | 9/1996 | Okase et al. | 118/724 |
| 5,571,330 | 11/1996 | Kyogoku | 118/719 |
| 5,578,132 | 11/1996 | Yamaga et al. | 118/724 |
| 5,658,417 | 8/1997 | Watanabe et al. | 156/345 |

FOREIGN PATENT DOCUMENTS

| | | | |
|---|---|---|---|
| 39 06 075 A1 | 8/1990 | Germany | 118/724 |
| 63-278226 | 11/1988 | Japan | 118/724 |
| 1-47018 | 2/1989 | Japan | 118/724 |
| 1-220437 | 9/1989 | Japan | 118/724 |
| 4-211119 | 8/1992 | Japan | 118/724 |
| 4-302145 | 10/1992 | Japan | 118/724 |

*Primary Examiner*—R. Bruce Breneman
*Assistant Examiner*—Jeffrie R. Lund
*Attorney, Agent, or Firm*—Jones & Volentine, L.L.P.

[57] ABSTRACT

A vertical diffusion furnace and a cap therefor are provided to minimize diffusion non-uniformity in a diffusion furnace caused by the positioning of a reaction gas outlet. In the vertical diffusion furnace, a reaction gas outlet is formed in the lower portion of a cap and adapted to extend downward through a flange. Thus, is provided a means to maintain diffusion uniformity in the diffusion furnace to comply with the necessity of processing large diameter wafers needed for highly integrated semiconductor devices. Thereby, a decrease in the rate of productivity for operating such equipment due to its positioning of a reaction gas outlet is prevented.

5 Claims, 4 Drawing Sheets

VERTICAL DIFFUSION FURNACE AND CAP THEREFOR

BACKGROUND OF THE INVENTION

The present invention relates to a vertical diffusion furnace and a cap therefor, and more particularly, to a vertical diffusion furnace and a cap therefor which minimizes the non-uniformity of diffusion caused by the positioning of a reaction gas outlet.

While individual elements for a semiconductor device have been scaled down in size to achieve a high integration within a chip, the overall chip size has increased to expand its capacity. In an effort to decrease manufacturing costs and to increase productivity yields for a semiconductor device, increasingly large-diameter wafers have been used. As a result, the need for efficiently processing such large-diameter wafers has required some modifications to equipment used in the manufacturing of the semiconductor devices.

A diffusion furnace is no exception to the need for such changes, since it is an essential part of processes for the fabrication of semiconductor devices. Due to recent advances in furnace technology, there is a trend towards utilizing a vertical diffusion furnace instead of a horizontal diffusion furnace for processing such large-diameter wafers.

A conventional vertical diffusion furnace for fabrication of a semiconductor device will be described in detail while referring to FIG. 1. In FIG. 1, the conventional diffusion furnace is illustrated in its sectional view.

Referring to FIG. 1, a plurality of sheets (50 to 100 sheets) of wafers 5 are loaded into a boat 3 in a reaction tube 1 which is positioned in a lengthwise placement in the conventional vertical diffusion furnace. For a diffusion process, the boat 3 (which is loaded with wafers 5) is supported by an underlying cap 7, and the boat and cap are both inserted into the reaction tube 1 by flange 9.

During a diffusion process in such a conventional furnace, a reaction gas is introduced into the reaction tube 1 through a reaction gas inlet 11. The reaction gas which has been introduced in such a manner flows in the directions indicated by the arrows in the FIG. 1 and is subsequently discharged through a reaction gas outlet 13 that is positioned at a lower side of the reaction tube 1.

The above conventional vertical diffusion furnace is advantageous over a horizontal furnace in that the fixation of the reaction gas outlet at the lower side of the reaction tube facilitates the management thereof. However, the lateral placement of the reaction gas outlet adversely influences the uniform flow of the reaction gas in the reaction tube. As a result, a wafer near the reaction gas outlet is not uniformly processed since it is affected by the exiting exhaust gas. Therefore, generally the process uniformity of wafers in the lower part of the reaction tube is lower than that of wafers in the upper part thereof. This problem can be sidestepped by simply conducting the entire process with the tube's lower part empty, but such a procedure significantly lowers the productivity efficiency rate of the equipment operation.

SUMMARY OF THE INVENTION

An object of the present invention is to provide a vertical diffusion furnace which minimizes non-uniformities in the diffusion process that are caused by a reaction gas outlet in a reaction tube, and thereby to enhance the productivity efficiency of the equipment.

Another object of the present invention is to provide a cap suitable for use in the above vertical diffusion furnace.

To achieve the above object, there is provided a vertical diffusion furnace comprising a reaction tube; a cap for supporting a boat loaded with wafers in the reaction tube; a flange having a hole for supporting the cap and for moving the boat to fit it into the reaction tube during a diffusion process; a reaction gas inlet for introducing a reaction gas into the reaction tube; and a reaction gas outlet for discharging the remaining reaction gas during the diffusion process, wherein the reaction gas outlet is formed in a lower portion of the cap and positioned to extend downward through the hole of the flange.

To achieve the other object, there is provided a cap comprising: an upper portion for supporting the boat in a vertical diffusion furnace; a lower portion having a reaction gas outlet; a first cylindrical portion adjacent to the upper portion, said portion having a cylindrical sidewall; a second cylindrical portion adjacent to the lower portion, said portion having a cylindrical sidewall; and a controlling plate inserted between the first and second cylindrical portions, wherein the controlling plate has holes for allowing a reaction gas to flow between the first and second cylindrical portions.

The vertical diffusion furnace of the present invention maintains the uniformity of diffusion throughout the boat area. Accordingly, large-diameter wafers can be processed in such a manner which is adapted to maintain a high rate of productivity efficiency for equipment operation.

DETAILED DESCRIPTION OF THE INVENTION

The above objects and advantages of the present invention will be come more apparent by a detailed description of preferred embodiments below and by referring to the attached drawings.

Figure 1:
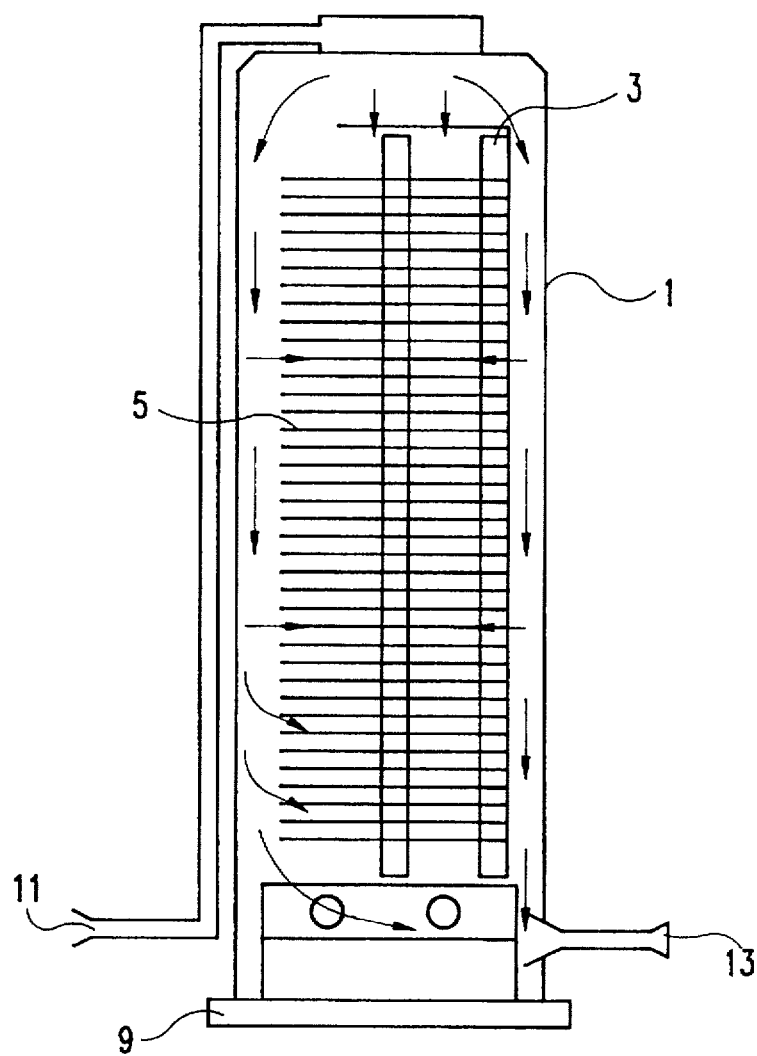
FIG. 1 is a sectional view of a conventional vertical diffusion furnace.
Figure 2:
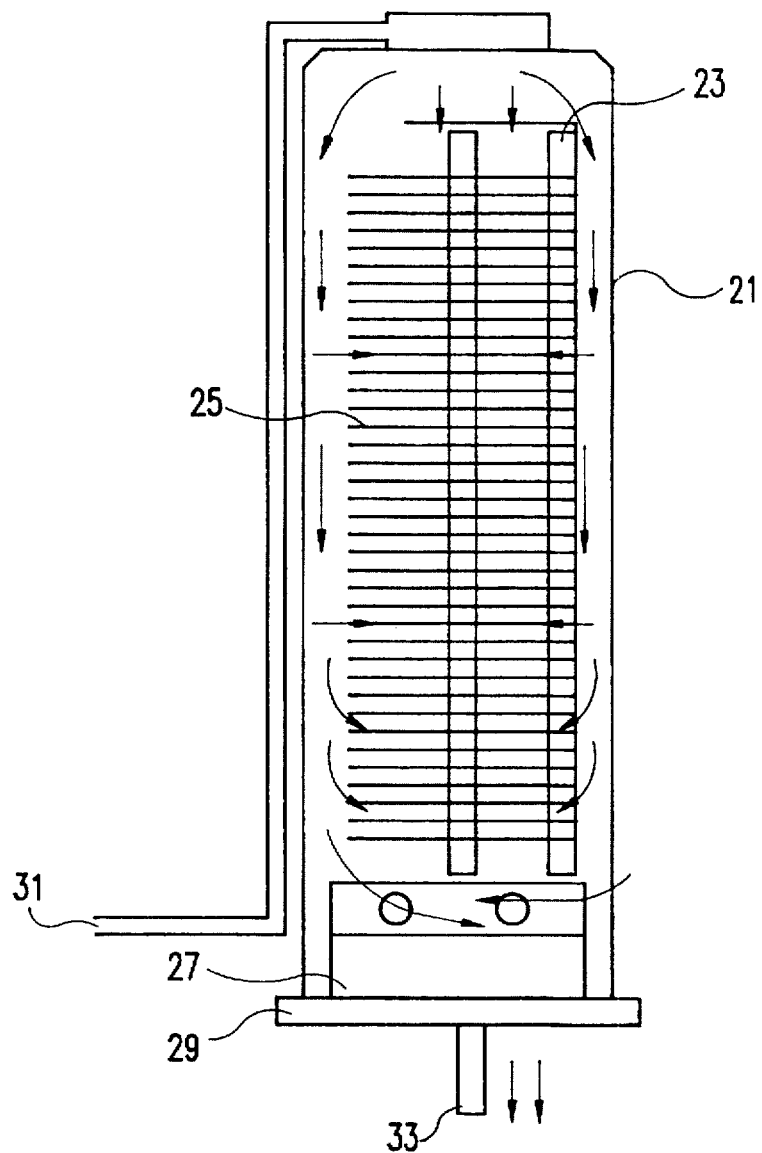
FIG. 2 is a sectional view of a vertical diffusion furnace according to the present invention.

FIG. 2 is a sectional view of a vertical diffusion furnace according to the present invention, wherein a reaction gas outlet is installed in a lower portion of a cap. A boat 23 is loaded with wafers 25 and inserted into a reaction tube 21 which is positioned along the length of the vertical diffusion furnace of the present invention and is supported by an underlying cap 27, and wherein the boat and cap are fitted into the reaction tube 21 by a flange 29 having a hole under the cap.

During a diffusion process, a reaction gas is introduced into the reaction tube 21 through a reaction gas inlet 31, and said gas diffuses into the reaction tube 21, and therein reacts on the surfaces of the wafers 25. The remaining reaction gas is discharged through a reaction gas outlet 33 under the flange 29 by closing the lower end of the reaction tube 21. In this embodiment, the reaction gas outlet 33 is installed in the lower portion of cap 27.

The structural symmetry of the vertical diffusion furnace is maintained since, in contrast to the prior art, the reaction gas outlet is positioned in the middle of the flange. Therefore, during diffusion, the reaction gas uniformly flows within the reaction tube in the directions indicated by arrows of FIG. 2, thereby improving the diffusion uniformity for the process.

Further, by providing for diffusion uniformity throughout the entire length of the reaction tube, the conventional problem of decreased equipment productivity efficiency caused by a conventional reaction gas outlet can be overcome.

A cap used in the vertical diffusion furnace can be modified according to the present invention to provide the means to maintain a uniform flow of the reaction gas in the reaction tube.

Figure 3:
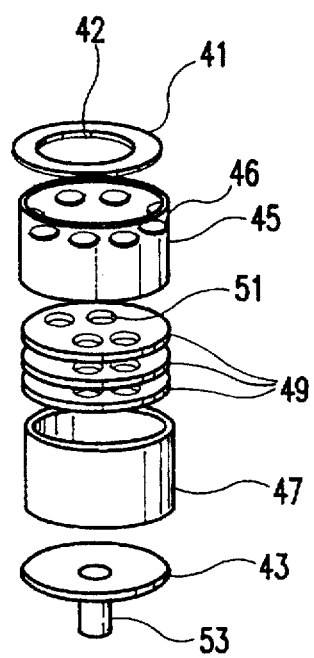
FIG. 3 illustrates a cap according to the present invention, which is utilized in the vertical diffusion furnace shown in FIG. 2.

FIG. 3 illustrates a cap adapted according to the present invention to increase the uniformity of the diffusion process in the vertical diffusion furnace of the present invention.

A cap used in the vertical diffusion furnace is comprised of an upper portion 41 for supporting a boat, a lower portion 43 for contacting a flange, between which are provided a first cylindrical portion 45 and a second cylindrical portion 47 for communicating with the upper and lower portions, respectively. In this embodiment, the first and second cylindrical portions 45 and 47 are placed in positions adjacent to the upper and lower portions 41 and 43, respectively. A controlling plate 49 is inserted between the first cylindrical portion 45 and the second cylindrical portion 47 to control the flow of a reaction gas in the cap.

In the conventional cap, a controlling plate is located in between a first cylindrical portion corresponding to present portion 45 and a second cylindrical portion corresponding to present portion 47 which serves to isolate the portions and to block the flow of the reaction gas. By contrast, in the cap of the present invention that increases the uniformity of the reaction gas in the reaction tube, a controlling plate 49 has controlling holes 51 for allowing the reaction gas to flow between the two portions. Further, in a preferred embodiment the number and sizes of the controlling holes 51 can be varied.

In addition, in order to introduce the reaction gas into the reaction tube via the first cylindrical portion 45, a plurality of the first holes 46 may be formed at the sidewall of the first cylindrical portion 45 and the second hole 42 may be formed in upper portion 41. A reaction gas aperture 53 is formed downward to discharge the reaction gas.

In the prior art, it is easy to connect the reaction gas outlet to a fixed outlet port, since the reaction gas outlet fixed to the reaction tube is stationary. By contrast, in the present invention the reaction gas outlet is formed in the lower portion of the cap and the reaction gas outlet moves up and down with the movement of a loaded boat being transferred into the reaction tube to perform diffusion. Therefore, a method for connecting the mobile reaction gas outlet to the fixed outlet port needed to be provided.

Figure 4:
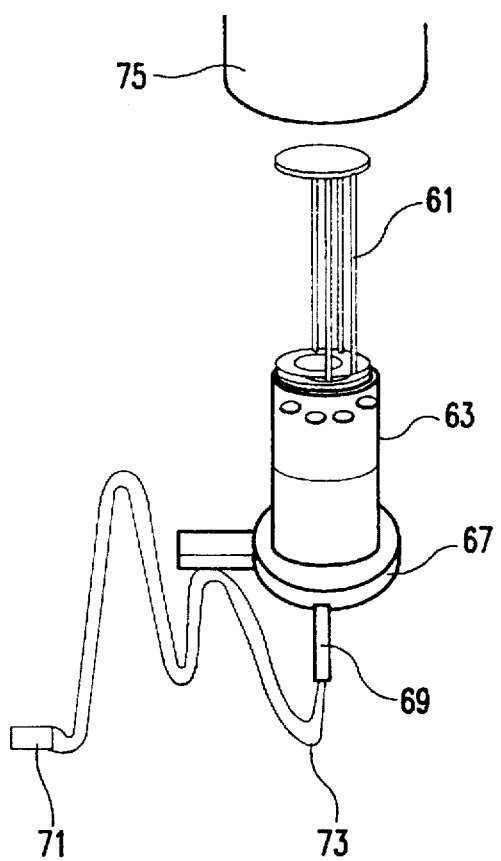
FIG. 4 and 5 schematically illustrate an embodiment of the present invention showing connection placements of the external outlet port for a reaction gas outlet in the vertical diffusion furnace according to the present invention.
Figure 5:
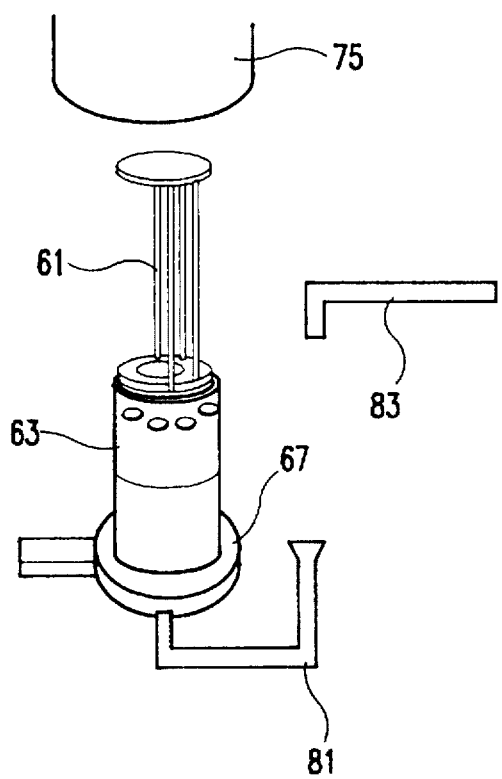

FIGS. 4 and 5 illustrate connections of the reaction gas outlet to an external outlet port in the vertical diffusion furnace of the present invention.

Referring to FIG. 4, a boat 61 and a cap 63 move up and down by a flange 67 disposed at the lower end of the cap. At the same time, a reaction gas outlet 69 moves along with the boat 61 and the cap 63. Thus, an exhaust line 73 is adapted for connecting to a fixed external outlet port 71 at a first end and to reaction gas outlet 69 at a second end. Preferably, the exhaust line 73 is made of a flexible material, for example, TEFLON® or polyvinyl chloride (PVC), so that reaction gas outlet 69 can move up and down.

Referring to FIG. 5, when the flange 67 is moved into the "up" position (i.e., inside reaction tube 75) to perform a diffusion process, a reaction outlet 81 is connected to an external outlet port 83, and the connecting means is adapted to be released when the flange is lowered from the reaction tube. In this embodiment the reaction gas outlet 81, which makes contact with the outlet port 83 during their connection is funnel-shaped to facilitate their connection. A spring is added to a portion of the outlet port 83 opposite to the portion contacting reaction gas outlet 81, to thereby easily connect reaction gas outlet 81 to outlet port 83 and to guard against damage.

As described above the reaction gas outlet can be connected to an external gas outlet by applications of the methods shown in FIGS. 4 and 5. However other connection means will be apparent to the ordinary practitioner in this field.

The present invention has been described in detail with reference to the above embodiments, but the present invention is not restricted to such embodiments. It is clearly contemplated and understood that many variations are possible within the scope and spirit of the present invention by persons who are skilled in the art. Further, such variations are intended to be within the scope of the invention and within the scope of the appended claims.

What is claimed is:

1. A vertical diffusion furnace comprising:

a reaction tube;

a cap for supporting a boat loaded with wafers in said reaction tube;

a flange having a hole, for supporting said cap, and moving to fit said boat into said reaction tube during a diffusion process;

a reaction gas inlet for introducing a reaction gas into said reaction tube; and a reaction gas outlet for discharging the remaining reaction gas during the diffusion process, wherein said reaction gas outlet is formed in a lower portion of said cap to extend downward through said hole of said flange.

2. A cap for supporting a boat loaded with wafers in a reaction tube, comprising:

an upper portion for supporting said boat in a vertical diffusion furnace;

a lower portion having a gas outlet;

a first cylindrical portion adjacent to said upper portion, said portion having a cylindrical sidewall;

a second cylindrical portion adjacent to said lower portion, said portion having a cylindrical sidewall; and a controlling plate inserted between said first and second cylindrical portions, wherein said controlling plate is adapted to have holes which permit a reaction gas to flow between said first cylindrical portion and said second cylindrical portion.

3. A cap as claimed in claim 2, wherein said controlling plate comprises a plurality of disks.

4. A cap as claimed in claim 2, wherein said upper portion has a first opening.

5. A cap as claimed in claim 2, wherein said first cylindrical portion has a plurality of second openings in the sidewall of said first cylindrical portion.

* * * * *